US012612698B2

(12) United States Patent　(10) Patent No.: US 12,612,698 B2

Mueller et al.　(45) Date of Patent: Apr. 28, 2026

(54) HOLDING DEVICE FOR HOLDING A MAGNETIZABLE SUBSTRATE DURING PROCESSING OF A SUBSTRATE SURFACE OF THE SUBSTRATE

(71) Applicant: Oerlikon Surface Solutions AG, Pfäffikon, Pfäffikon (CH)

(72) Inventors: Dieter Mueller, Bingen am Rhein (DE); Max Siebert, Bolanden (DE); Christoph Hoeweling, Bad Salzdetfurth (DE)

(73) Assignee: Oerlikon Surface Solutions AG, Pfäffikon, Pfäffikon (CH)

( * ) Notice: Subject to any disclaimer, the term of this patent is extended or adjusted under 35 U.S.C. 154(b) by 664 days.

(21) Appl. No.: 17/786,805

(22) PCT Filed: Dec. 16, 2020

(86) PCT No.: PCT/EP2020/086512

§ 371 (c)(1),
(2) Date: Jun. 17, 2022

(87) PCT Pub. No.: WO2021/122810

PCT Pub. Date: Jun. 24, 2021

(65) Prior Publication Data

US 2023/0042478 A1　Feb. 9, 2023

(30) Foreign Application Priority Data

Dec. 19, 2019　(DE) ..................... 10 2019 135 182.0

(51) Int. Cl.
C23C 16/458　(2006.01)
(52) U.S. Cl.
CPC ...... C23C 16/4581 (2013.01); C23C 16/4584 (2013.01)

(58) Field of Classification Search
USPC ........................... 118/500; 211/70.6, DIG. 1
See application file for complete search history.

(56) References Cited

U.S. PATENT DOCUMENTS

| | | | |
|---|---|---|---|
| 4,531,645 A * | 7/1985 | Tisbo | B25H 3/06 211/163 |
| 5,577,426 A | 11/1996 | Eggert et al. | |

(Continued)

FOREIGN PATENT DOCUMENTS

| | | |
|---|---|---|
| CN | 1349655 A | 5/2002 |
| CN | 104584201 A | 4/2015 |

(Continued)

OTHER PUBLICATIONS

International Preliminary Report on Patentability for PCT Application No. PCT/EP2020/086512 mailed May 17, 2022, with its English translation, 8 pages.

(Continued)

*Primary Examiner* — Yewebdar T Tadesse
(74) *Attorney, Agent, or Firm* — Christian S. Hans; Bret E. Field; Bozicevic, Field & Francis LLP

(57)　ABSTRACT

The invention relates to a holding device (2) for holding a magnetizable substrate (8) during machining of at least one substrate surface, in particular of a magnetizable tool to be machined, comprising a magnetic holding unit (4) arranged at the end for fixing the substrate (8) at the end by forming a magnetic field, a receiving unit (6) arranged on the holding unit (4) for receiving the substrate (8), a replaceable adapter unit (10) arranged within the receiving unit (6) for guiding and shielding the substrate (8), the adapter unit (10) having at least one recess (12) for the feedthrough of the substrate (8), the substrate (8) being fixable within the holding device (2) in a laterally supported manner by means of the recess (12).

15 Claims, 8 Drawing Sheets

(56)          References Cited

U.S. PATENT DOCUMENTS

Figure 1:
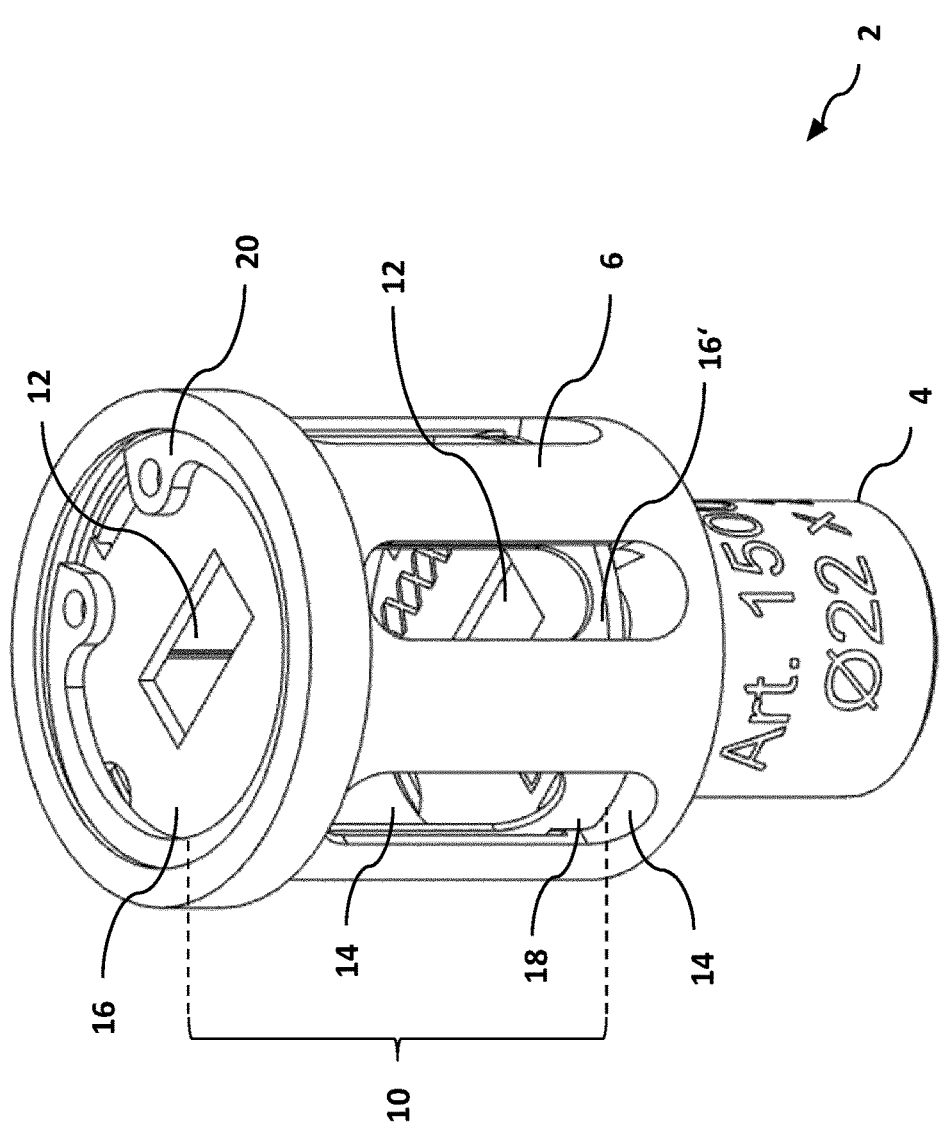

| | | | |
|---|---|---|---|
| 7,048,824 | B1 | 5/2006 | Werfel et al. |
| 7,837,033 | B2 * | 11/2010 | Schein ..................... B25H 3/00 |
| | | | 211/DIG. 1 |
| 9,694,990 | B2 | 7/2017 | Voser et al. |
| 10,072,326 | B2 | 9/2018 | Siebert et al. |
| 10,330,698 | B2 | 6/2019 | Pinno-Rath et al. |
| 11,590,528 | B2 | 2/2023 | Vogel et al. |
| 2007/0062803 | A1 | 3/2007 | Purdy et al. |
| 2008/0286608 | A1 | 11/2008 | Quinto et al. |
| 2009/0071299 | A1 | 3/2009 | Lin |
| 2010/0258464 | A1 | 10/2010 | Schein et al. |
| 2012/0021137 | A1 | 1/2012 | Quinto et al. |
| 2018/0030595 | A1 | 2/2018 | Kim et al. |
| 2018/0105935 | A1 | 4/2018 | Kölker et al. |

FOREIGN PATENT DOCUMENTS

| | | |
|---|---|---|
| CN | 105579611 A | 5/2016 |
| CN | 110312820 A | 10/2019 |
| DE | 102010040642 A1 | 3/2012 |
| DE | 102017124236 A1 | 4/2018 |
| DE | 202018102669 U1 | 5/2018 |
| EP | 1881086 A1 | 1/2008 |
| EP | 2823940 A1 | 1/2015 |
| EP | 3569335 A1 | 11/2019 |
| JP | 2008-124497 A | 5/2008 |
| JP | 2009-249726 A | 10/2009 |
| JP | 2015-21142 A | 2/2015 |
| JP | 2016-3386 A | 1/2016 |
| KR | 10-2013-0115828 A | 10/2013 |
| WO | WO03034419 A1 | 4/2003 |
| WO | WO2016128579 A1 | 8/2016 |
| WO | WO2018149548 A1 | 8/2018 |

OTHER PUBLICATIONS

Office Action for German Application No. 10 2019 135 182.0 mailed Jul. 23, 2020, with its English summary, 7 pages.

Office Action for Japan Patent Application No. 2022-537645, mailed Dec. 24, 2024, and its English translation, 16 pages.

First Notice of Review Observations for Chinese Application No. 202080095615.0 mailed Sep. 11, 2023, with its English translation, 30 pages.

Office Action for Japan Patent Application No. 2022-537645, mailed May 27, 2025, and its English translation, 6 pages.

Office Action for Korean Patent Application No. 10-2022-7024972, mailed Jun. 19, 2025, and its English translation, 12 pages.

Office Action for Mexican Patent Application No. MX/a/2022/007718, mailed Oct. 10, 2025, and its English translation, 14 pages.

* cited by examiner

HOLDING DEVICE FOR HOLDING A MAGNETIZABLE SUBSTRATE DURING PROCESSING OF A SUBSTRATE SURFACE OF THE SUBSTRATE

The present invention relates to a holding device for holding a magnetizable substrate during a processing of at least one substrate surface, and to a system and method for transporting and/or processing a plurality of substrates.

Particularly in the machining of sensitive precision tools, such as workpieces formed in the form of miniature, cutting, stamping and embossing tools, the transport and holding operations take up a significant part of the overall effort of the machining processes concerned. In machining processes for the surface treatment of tools, such as coating processes, the tools to be machined are packaged individually at the customer's premises and shipped to the corresponding machining centers prior to machining. The tools are then treated in various steps in the machining center, for example unpacked, cleaned, coated, blasted and individually packaged again for shipment to the customer. The individual packaging is necessary to protect the tools from damage. All these individual handling steps result in a very large expenditure of time and at the same time a great risk of damage to individual tools. Moreover, it is not possible to ensure consistent quality of the tools. Especially when processing filigree precision parts, the handling effort and the associated risk of damage are particularly high.

It is therefore an object of the present invention to at least partially eliminate the aforementioned disadvantages of known holding devices for holding a magnetizable substrate and systems for transporting and/or machining substrates, in particular workpieces or tools to be machined. In particular, it is an object of the invention to provide a device and a system that enable stable fixation of substrates during transport and/or machining in a simple and cost-effective manner, thus minimizing the handling effort required for machining the substrates. In addition, it is an object of the invention to ensure a particularly precise arrangement of the substrates during a processing, which enables a particularly precise processing of the substrates concerned.

The foregoing object is solved by a holding device for holding a substrate having the features of the independent device claim, a system for transporting and/or processing a plurality of substrates having the features of the independent system claim, and a method for transporting and/or processing a plurality of substrates having the features of the independent method claim. Further features and details of the invention result from the respective dependent claims, the description and the drawings. Features and details described in connection with the holding device according to the invention naturally also apply in connection with the system according to the invention as well as the method according to the invention and vice versa in each case, so that with regard to the disclosure concerning the individual aspects of the invention reference is or can always be made mutually.

According to the invention, a holding device for holding a magnetizable substrate during processing of at least one substrate surface, in particular for holding a magnetizable workpiece or tool to be processed, is provided, which comprises a magnetic holding unit arranged at the end for fixing the substrate at the end by forming a magnetic field, a receiving unit arranged on the holding unit for receiving the substrate, and a replaceable adapter unit arranged inside the receiving unit for guiding and shielding the substrate. According to the invention, the adapter unit has at least one recess for the feedthrough of the substrate, whereby the substrate can be fixed within the holding device in a laterally supported manner by means of the recess.

The present holding device can be used both for transport and for the treatment or processing of substrates or processing of at least one substrate surface. The treatment can be carried out, for example, abrasively and/or chemically and comprise, in particular, cleaning, pre-treatment and/or post-treatment as well as coating of the substrates. It is understood that an object magnetizable substrate can also be formed to be only partially magnetizable, i.e., for example, can have a magnetizable component, such as a magnetizable holding handle or a partially magnetizable holding handle. The magnetizable substrate can further be formed in particular in the form of a magnetizable workpiece or a magnetizable tool. In particular, sensitive precision tools, such as shank tools or punching tools, in particular miniature, cutting, punching, embossing or forming punches, can be considered as possible tools. The holding device according to the invention is designed/configured in particular to hold only a single substrate. This allows the greatest possible freedom with regard to the selection of processing methods and also permits, for example, two- and three-dimensional rotations during a machining process, such as during coating or the like. Magnetic fixation can advantageously take place via contact of the holding device with an end face of a magnetizable substrate, preferably the end face of a magnetizable tool to be machined. In addition to lateral guidance of the substrates, the holding device, in particular the adapter unit, serves in particular to shield or mask them in surface treatment processes, such as coating processes. According to the invention, it is provided in particular that the same holding device can be used for processing different substrates, in particular differently shaped tools, by merely modifying or replacing the adapter unit. The recess for guiding the substrates does not have to be designed/configured for a precise fit for a substrate to be accommodated and therefore does not have to be in full contact with the substrate in question during accommodation of a substrate, but can also be only partially in contact with the substrate.

Within the scope of the invention, it has been recognized that the use of a holding device according to the invention completely eliminates the handling of individual tools during transport and processing operations, thus considerably reducing the risk of damage to the substrates. In addition, the use of a holding device according to the present invention allows a particularly precise arrangement of the substrates, which permits particularly precise processing of the substrates. In addition, the use of the present holding device, in particular the replaceable adapter unit according to the invention, makes one and the same holding device suitable for use with a large number of different substrates by merely modifying or replacing the adapter unit, which enormously reduces the necessary number of variants of present holding devices.

In the context of a particularly compact arrangement and to ensure particularly homogeneous processing of a substrate, it can be advantageously provided that the receiving unit is shaped like a hollow cylinder and is arranged relative to the replaceable adapter unit and the magnetic holding unit in such a way that a substrate can be arranged centrally within the receiving unit. A central arrangement is understood here to mean in particular an arrangement in which the substrate has at least substantially the same distance from the edge regions of the receptacle unit along its receptacle within the receptacle unit.

With regard to ensuring processing of a substrate during a pickup, in particular with regard to particularly homogeneous processing of a substrate, it can be provided in an objectively advantageous manner that the pickup unit has recesses for contacting the substrate, the recesses preferably being arranged symmetrically within the pickup unit, in particular being formed in the form of cutouts arranged on the longitudinal side. In particular, this permits direct contacting of the substrate during processing, for example by means of cleaning liquids, drying air, coating agents and the like.

With regard to a stable arrangement of a substrate during processing, it can also be advantageously provided that the replaceable adapter unit has at least one guide means/element for guiding the substrate, wherein the recess for guiding the substrate is arranged within the guide element, wherein the recess for guiding the substrate is preferably arranged centrally within the guide element. The recess can here preferably be formed in the form of a bore or the like and in particular be adapted to the geometry of the substrate to be guided. In addition to guiding a substrate, the guide element can also serve to shield or mask the substrate, for example during a surface processing operation or the like.

In the context of a particularly simple replacement or a particularly simple and fast adaptation, it can also be advantageously provided that the guide element is formed in the form of a flat piece, in particular in the form of a guide disk. In this case, the disc can be specifically shaped to the substrates to be processed, in particular with regard to the recess, so that when changing different substrates to be processed, only the guide element needs to be replaced and one and the same holding device can be used for transporting and handling different substrates, for example different punching tools.

With regard to a lightweight and material-saving design/configuration, the guide element can have a low material thickness of less than 2 mm, preferably a material thickness between 1.5 mm and 1 mm. With a material thickness between 1.5 mm and 1 mm, particularly good results could be achieved with regard to reliable and precise machining. A material thickness of less than 1 mm, on the other hand, carries the risk of a negative influence on the material due to thermal effects.

In the context of a particularly stable arrangement of a substrate during processing, it is further conceivable that the replaceable adapter unit comprises at least a second guide element for guiding the substrate, wherein the second guide element preferably comprises a centrally arranged recess for the feedthrough of the substrate, which recess is arranged in particular centrally within the guide element.

In order to enable both stable guidance and simple insertion of a substrate into the holding device, it can be provided here in particular that the second guide element is arranged at a distance from the first guide element, in particular is arranged congruently with the first guide element. In the context of the invention, a congruent arrangement is understood to mean in particular an arrangement in which the two preferably centrally arranged recesses for the feedthrough of the substrate are arranged one above the other with an exact fit.

Regarding maximizing stabilization, it is further conceivable according to the invention that the interchangeable adapter unit comprises more than two guide element, in particular more than three guide element for guiding the substrate.

In order to ensure optimum positioning of one or more guide element, it can be advantageously provided in accordance with the invention that the replaceable adapter unit has a spacing means/element for spacing the guide element, the spacing element preferably being arranged directly on the guide element, in particular directly between the first and second guide element. In the context of the invention, a direct arrangement is understood to mean in particular an arrangement in which the spacing element is in contacting abutment with the guide element. Preferably, the guide element can rest at least partially on the spacing element.

To ensure a simple, cost-effective and flexible connection between one or more guide element and the spacing element in question, the guide element can preferably be connected to the spacing element via force-fitting, for example via latching hooks, latching lugs or connecting lugs. For example, a three-part arrangement may be provided in which the guide element are forcedly fitted to the spacing element. Within the scope of a stable arrangement, the guide element can alternatively also be connected to each other in a material-bonding manner, for example via an arc welding process (e.g. a TIG welding process) or via a beam welding process (e.g. a laser welding process).

With regard to ensuring a processing of a substrate during a pickup, in particular a particularly homogeneous processing of a substrate during a pickup, it can be provided in an objectively advantageous manner that the spacing element has recesses for contacting the substrate, the recesses preferably being arranged symmetrically within the pickup unit, in particular being formed in the form of cutouts arranged on the longitudinal side. This permits, in particular, direct contacting of the substrate in the course of processing, for example by means of cleaning liquids, drying air, coating agents and the like.

In the context of a particularly compact arrangement and of ensuring particularly homogeneous processing of a substrate, it can be provided in an objectively advantageous manner that the spacing is shaped like a hollow cylinder and is arranged symmetrically within the receiving unit, preferably arranged within the receiving unit in such a way that the recesses of the spacing overlap at least partially, in particular completely, with the recesses of the receiving unit.

Within the scope of a structurally simple fixation of the guide element or the guide element to the spacing means/element or to the receiving unit according to the invention, it can be advantageously provided that the adapter unit has a fixing means/element for fixing the adapter unit within the receiving unit, the fixing element preferably being formed in the form of a spring element, in particular in the form of a clamping ring. The fixing element is here preferably arranged above one or more guide element, in particular directly above the first guide element.

Within the scope of a constructively simple possibility of guaranteeing a magnetic holding force, it can also be provided that the magnetic holding unit has a magnet, for example a permanent magnet, which is preferably completely encapsulated within the holding unit, the magnet being formed in particular in the form of a temperature-resistant magnet, especially preferably a temperature-resistant magnet for temperatures of 450° C. or higher. A samarium-cobalt magnet, e.g., a SmCo magnet of the $Sm_2Co_{17}$ type, is a possible magnet for this purpose. In the context of the invention, an encapsulation is understood to mean in particular a complete enclosure. In this context, the magnet may preferably be cylindrically shaped and have a diameter of less than 20 mm, preferably less than 15 mm, in particular less than 10 mm. Due to the encapsulation, it is possible that the magnetic force serves only for fixation and cannot adversely influence processing operations to be carried out, such as coating operations, in particular plasma coating operations or the like. A suitable magnet in conjunction with a corresponding encapsulation offers the particular advantage of guaranteeing secure fixing in conjunction with a simultaneous low influence on the processing operations to be carried out.

With regard to a constructively simple possibility of magnetic shielding, it can be provided in particular that the magnet is arranged within the holding unit in such a way that a material thickness of at least 0.5 mm of the holding unit is arranged between the magnet and the receiving unit arranged directly on the holding unit. This ensures in particular that there is no direct contact between the magnet and the substrate. The magnet can preferably be pressed into the holding unit by means of a locking bolt or the like.

Within the scope of a cost-effective and constructively simple possibility of ensuring protection of the substrates arranged in the holding devices, in particular during transport of the substrates, it can be provided in an advantageous manner according to the invention that a protective cover is provided for protecting the substrate which can be arranged inside the holding device, the protective cover having an opening via which the protective cover can preferably be fastened at the end to the receiving unit, in particular can be fastened positively and/or non-positively to the receiving unit. In this case, the protective cover can preferably be in the form of a protective or transport cap or the like and, in particular, be designed/configured as a rotary part. In particular, the protective cover can be manufactured in such a way that it can be fastened to the receiving unit with a tolerance of 0.3 mm.

Similarly, with respect to ensuring accurate placement of a substrate within a holding device, the protective cover may include a second opening for detecting an orientation of a substrate disposable in the holding device, the second opening preferably being disposed opposite the first opening.

Within the scope of a cost-effective design/configuration, it is particularly conceivable here that the protective cover is formed at least partially, preferably completely, from a plastic, the plastic being formed in particular in the form of polyethylene and/or polyvinyl chloride and/or polyethylene terephthalate and/or polystyrene. It is understood that, in addition to the plastics mentioned, similar plastics with comparable properties can also be used.

It is also an object of the invention to provide a system for transporting and/or processing a plurality of substrates. Here, the system according to the invention comprises a plurality of holding devices described above for holding a substrate as well as a holding unit for holding the holding device. According to the invention, the plurality of holding devices are arranged within the receiving unit in such a way that, when a substrate is received separately, a common transport and/or a common processing of the plurality of received substrates can be carried out within a holding device. Thus, the system according to the invention has the same advantages that have already been described in detail with respect to the holding device according to the invention.

Within the scope of a structurally simple design/configuration of the present system, it is particularly conceivable that the holding unit is formed in the form of a basket with a plurality of holding devices for holding the holding devices, wherein the holding devices are preferably fastened in the holding elements in a form-fitting and/or force-fitting manner.

With regard to a structurally simple design/configuration of a system for a transport of a plurality of subject holding devices, it is also conceivable that a transport box is provided for receiving the receiving unit, wherein the receiving unit can be fixed within the transport box by means of the damping element, wherein the damping elements are preferably formed in the form of foam inserts. In addition, the transport box can advantageously have a lid which is preferably designed/configured in such a way that, in the mounted state, it fixes the holding devices arranged inside the receiving unit inside the receiving unit, in particular via a contact on the protective covers arranged on the holding devices.

With regard to a structurally simple design/configuration of a system for processing a plurality of substrates, it is also conceivable that a rotatable translation unit is provided for translating the pick-up unit for processing, in particular for coating, the substrates arranged within the holding devices of the pick-up unit in an x, y and z direction. By means of such a translation unit, it is possible in particular to easily perform even double or triple rotations for coating processes or the like.

It is also an object of the invention to provide a method for transporting and/or processing a plurality of substrates. Here, the method according to the invention comprises the steps/stages of receiving a plurality of substrates in a respective holding device, receiving the plurality of holding devices equipped with a respective substrate in a receiving unit for receiving the holding devices, and performing a common transport and/or a common processing of the plurality of received substrates. Thus, the method according to the invention has the same advantages as have already been described in detail with respect to the holding device according to the invention as well as the system according to the invention.

With regard to a safe and damage-free transport of a plurality of substrates, it can be provided in particular that the holding devices are fixed in a form-locking and/or force-locking manner in receiving elements of the receiving unit before a joint transport of the substrates, wherein the receiving unit is preferably transferred into a transport box before a joint transport of the substrates and wherein the receiving unit is fixed within the transport box before a joint transport of the substrates, in particular by means of damping elements.

With regard to a structurally simple, safe and damage-free processing of a plurality of substrates, it can be provided in particular that the holding devices in the pick-up unit are transferred to a rotatable translation unit for the translation of the pick-up unit before a joint processing of the substrates, whereby the pick-up unit is preferably moved in at least two spatial directions x, y during a joint processing of the substrates.

With regard to a processing of substrates, in particular of tools to be processed, it can be provided in an objectively advantageous manner that a pre- and/or post-treatment and/or a surface processing is provided, wherein the pre- and/or post-treatment preferably comprises a cleaning in an ultrasonic bath and/or a chemical cleaning and/or a drying and wherein a surface processing comprises in particular a plasma coating process.

Further advantages, features and details of the invention will be apparent from the following description, in which embodiments of the invention are described in detail with reference to the drawings. In this connection, the features mentioned in the claims and in the description may each be essential to the invention individually or in any combination.

Figure 2:
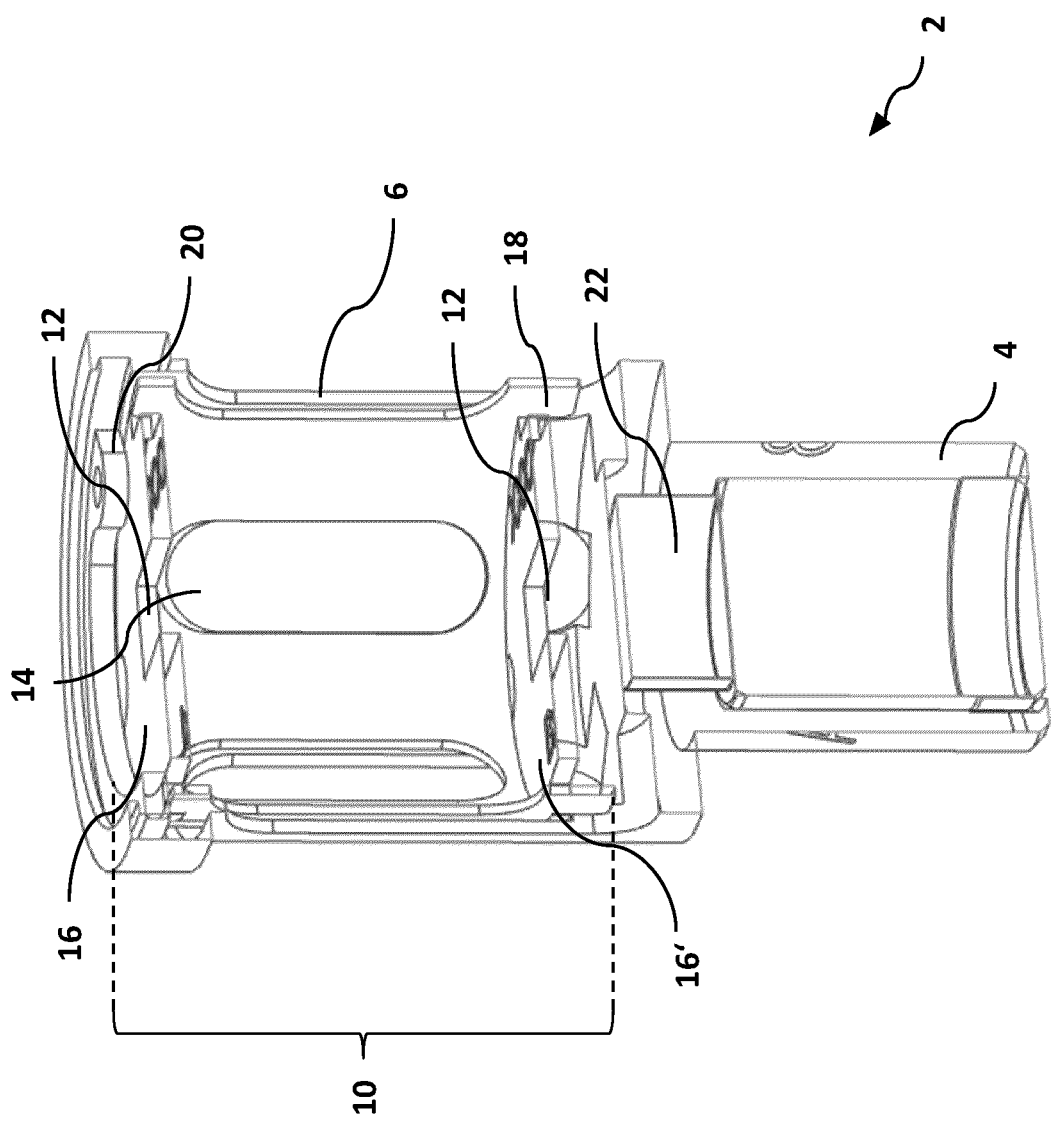
Figure 3:
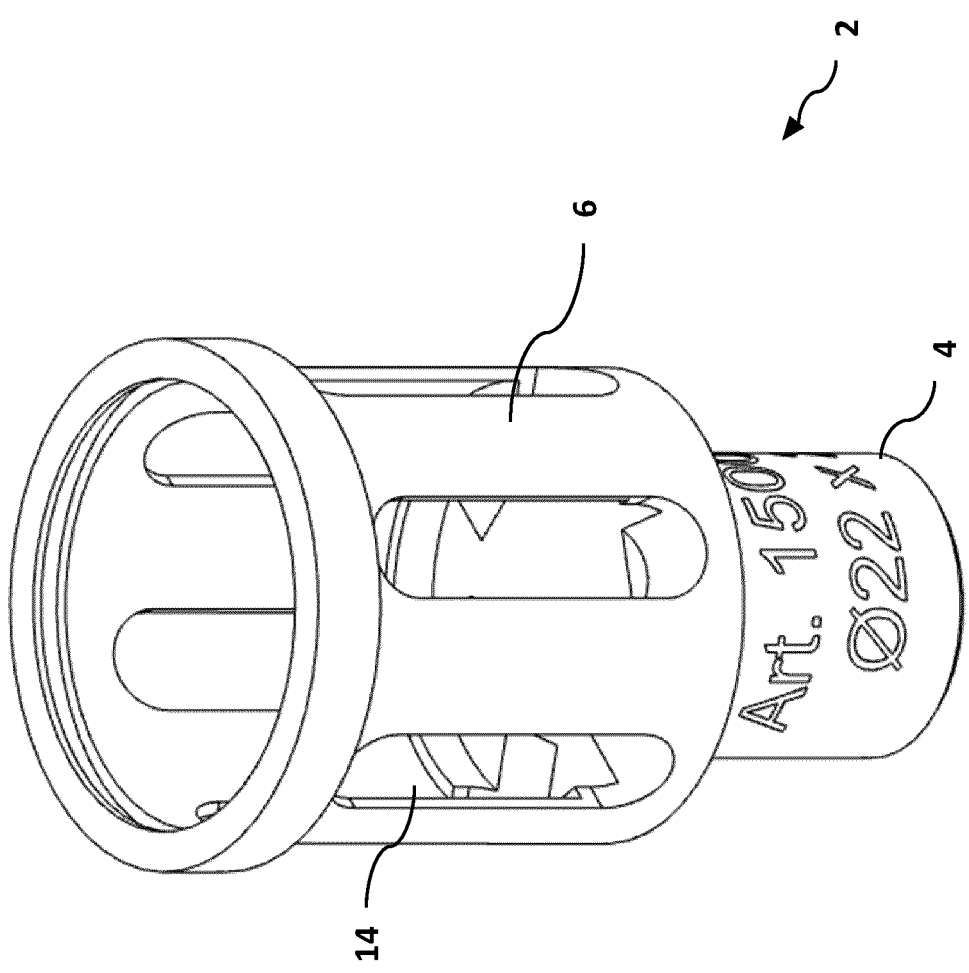
Figure 4:
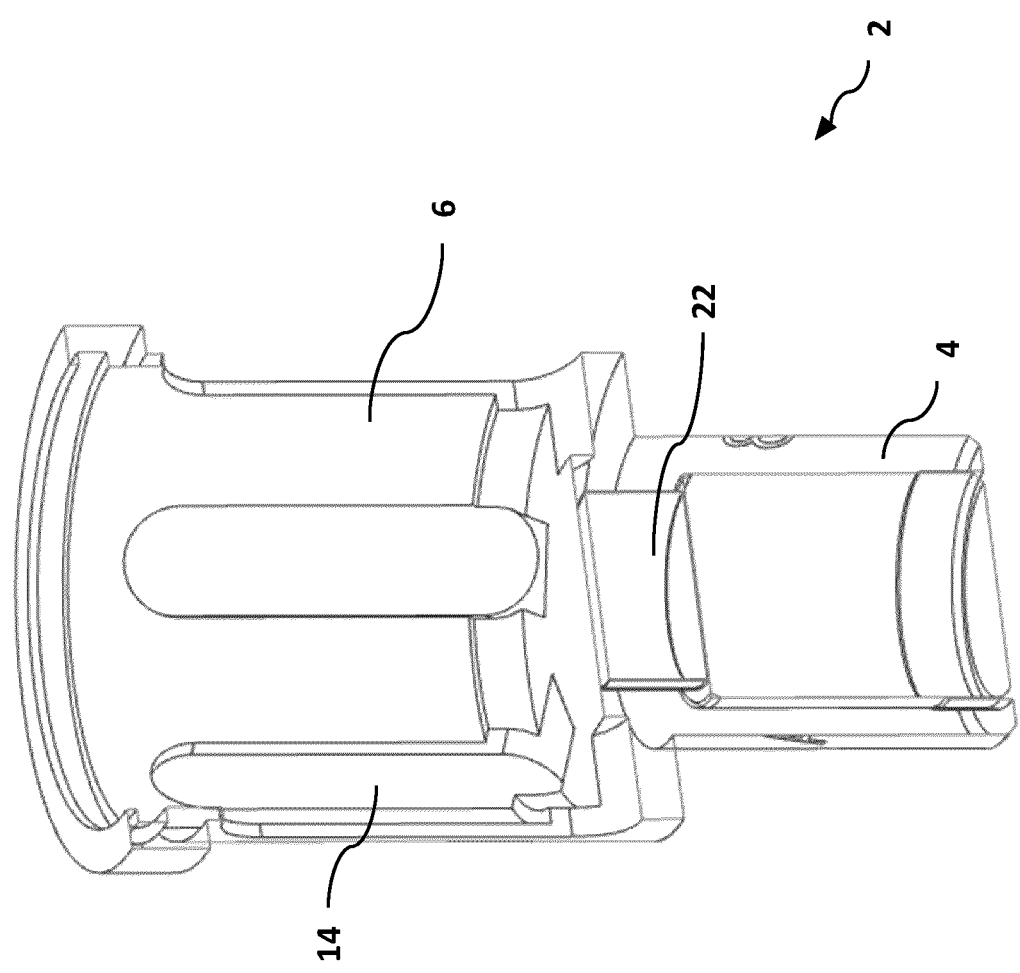
Figure 5:
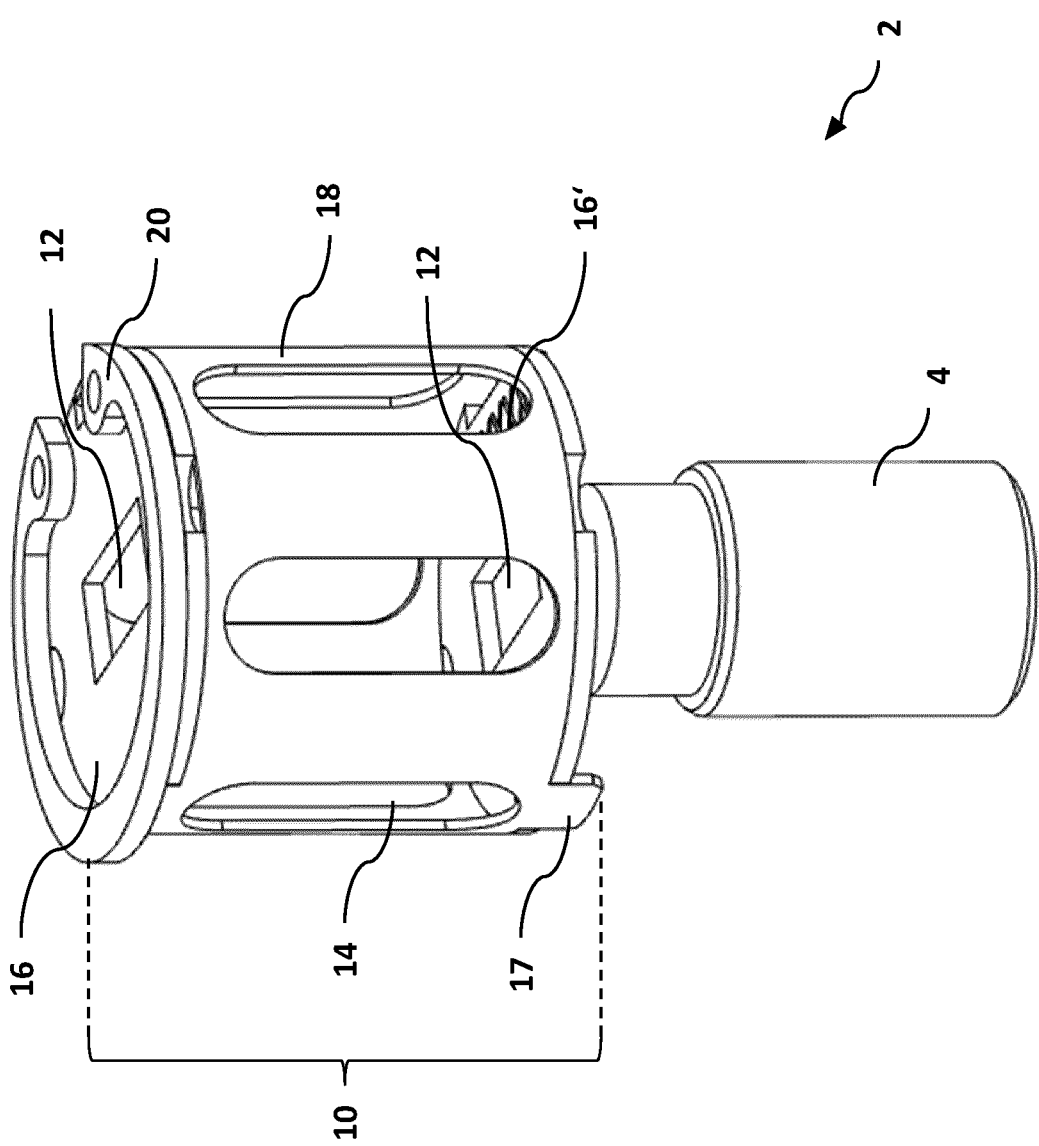
Figure 6:
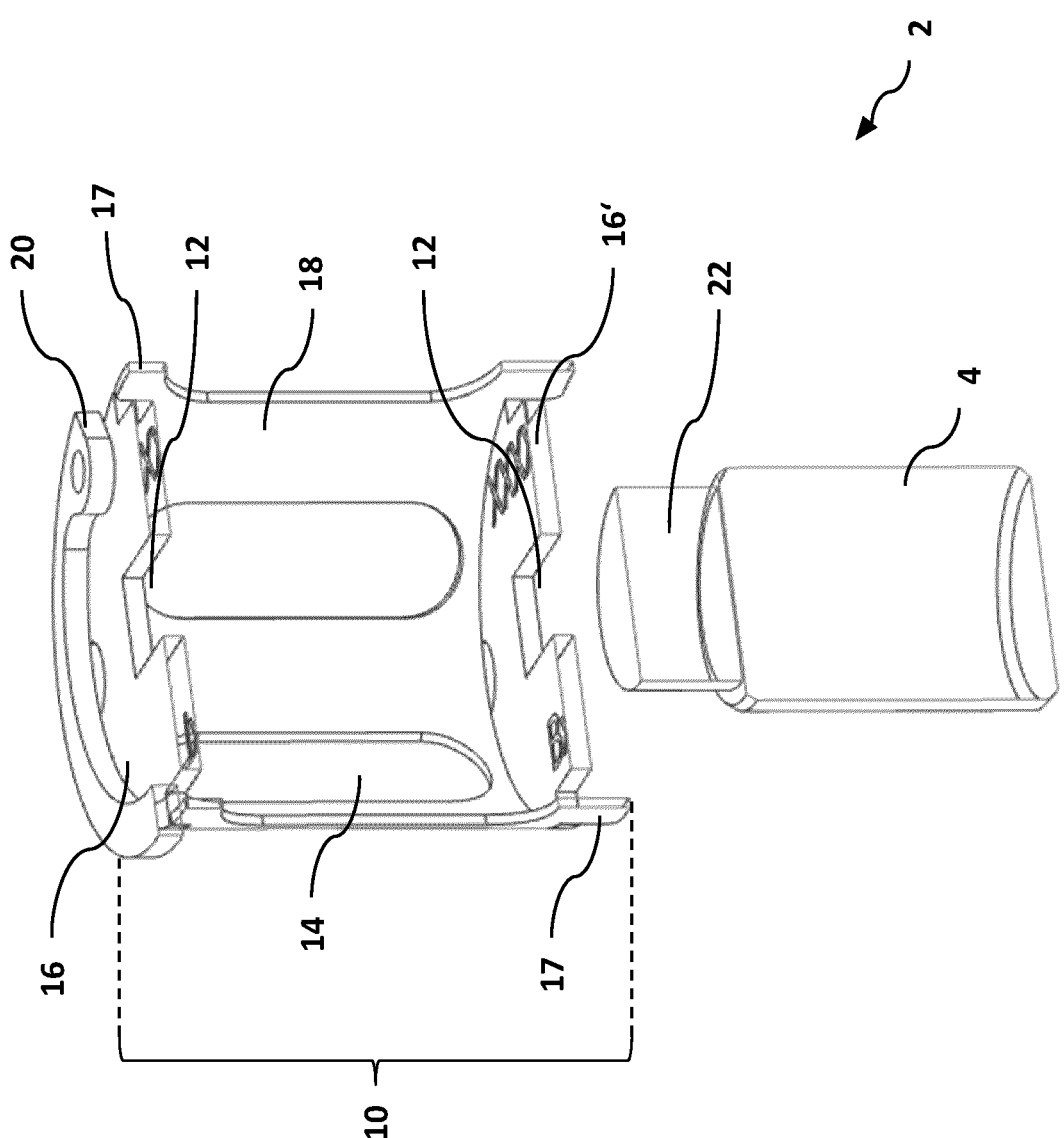
Figure 7:
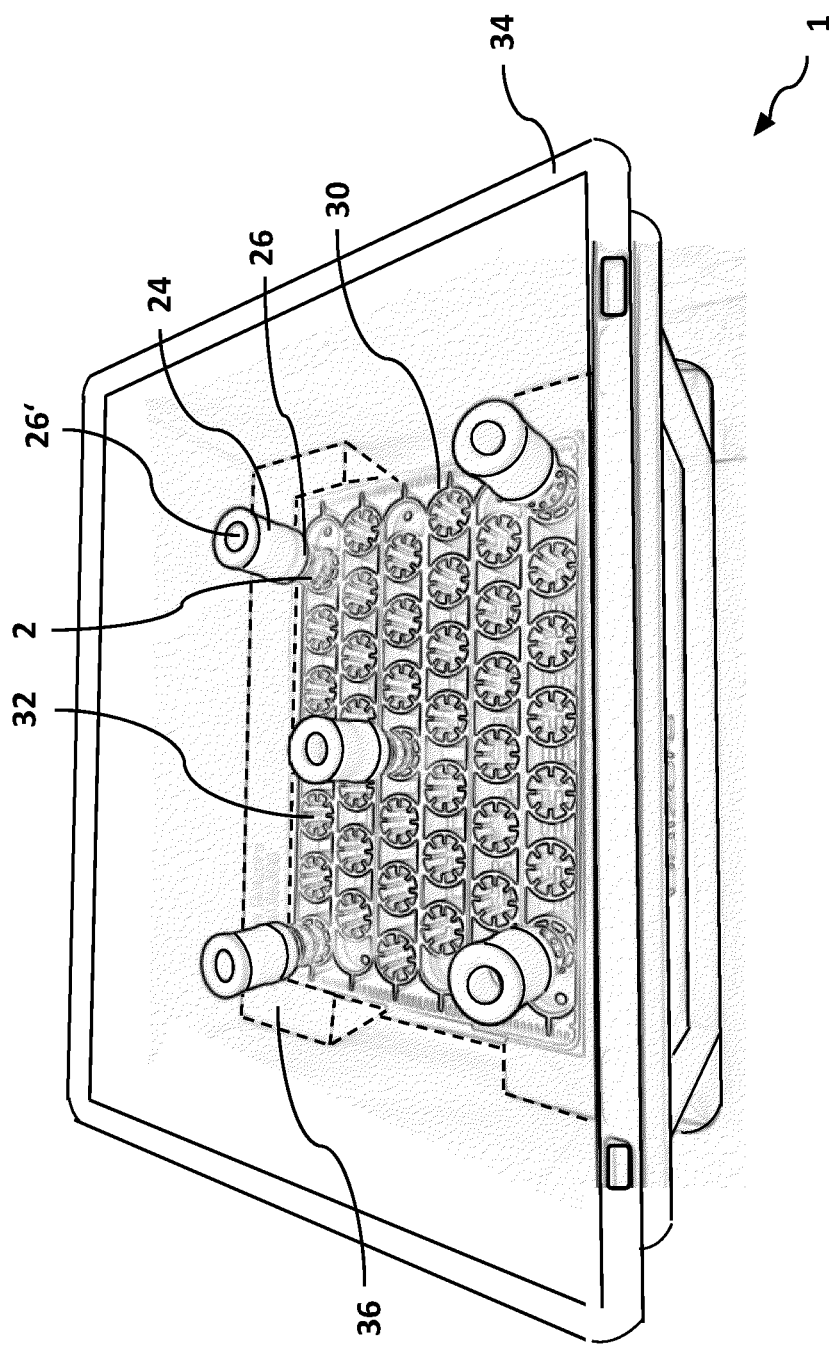
Figure 8:
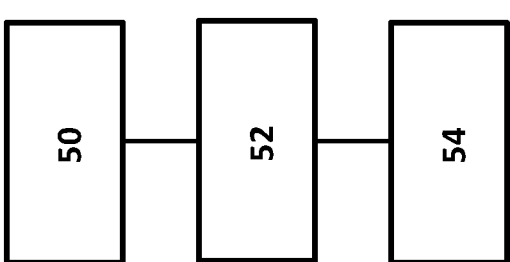

It shows:

FIG. 1 a schematic representation of a holding device according to the invention for holding a magnetizable substrate in a spatial view, FIG. 2 a schematic representation of a holding device according to the invention as shown in FIG. 1 in a sectional view, FIG. 3 a schematic representation of a part of a holding device according to the invention for holding a magnetizable substrate in a spatial view, FIG. 4 a schematic representation of the part of a holding device according to the invention for holding a magnetizable substrate according to FIG. 3 in a sectional view, FIG. 5 a schematic representation of a further part of the holding device according to the invention for holding a magnetizable substrate in a spatial view, FIG. 6 a schematic representation of the further part of a holding device according to the invention for holding a magnetizable substrate according to FIG. 5 in a sectional view, FIG. 7 a schematic representation of a system according to the invention for transporting and/or processing a plurality of substrates in a spatial representation, FIG. 8 a schematic representation of the individual steps/stages of a process according to the invention for transporting and/or processing a plurality of substrates.

FIG. 1 shows a schematic representation of a holding device 2 according to the invention for holding a magnetizable substrate 8 (not shown here) in a spatial view.

The holding device 2 comprises a magnetic holding unit 4 arranged at the end for fixing the substrate 8 at the end by forming a magnetic field, a receiving unit 6 arranged on the holding unit 4 for receiving the substrate 8, and a replaceable adapter unit 10 arranged inside the receiving unit 6 for guiding and shielding the substrate 8. The adapter unit 10 also has a recess 12 for the substrate 8 to feed through, it being possible to fix the substrate 8 in a laterally supported manner inside the holding device 2 by means of the recess 12.

The receiving unit 6 is shaped like a hollow cylinder and is arranged relative to the replaceable adapter unit 10 and the magnetic holding unit 4 in such a way that a substrate 8 can be arranged centrally within the receiving unit 6. In this case, the receiving unit 6 has recesses 14 for contacting the substrate 8, which are presently arranged symmetrically within the receiving unit 6 and are formed in the form of cutouts 14 arranged on the longitudinal side. It is understood that an asymmetrical arrangement of the recesses 14 within the receiving unit 6 can also be provided.

The replaceable adapter unit 10 further comprises a first and a second guide element 16, 16' for guiding the substrate 8, which each have a recess 12 for the feedthrough of the substrate 8, which recess 12 is arranged centrally within the guide element 16, 16' in the present case. Likewise, a decentralized arrangement of the recess 12 within the guide element 16, 16' could also be provided here. The guide element 16, 16' are presently designed/configured in the form of guide discs. Furthermore, the replaceable adapter unit 10 comprises a spacing element 18 for spacing the guide element 16 or the guide element 16, 16', wherein the spacing element 18 is presently arranged directly between the first and second guide element 16, 16'. The spacing element 18 also has recesses 14 for contacting the substrate 8, which completely overlap with the recesses 14 of the receiving unit 6.

Furthermore, the adapter unit 10 comprises a fixing element 20 for fixing the adapter unit 10 within the receiving unit 6, wherein the fixing element 20 is presently formed in the form of a clamping ring.

FIG. 2 shows a schematic representation of the holding device 2 according to the invention for holding a magnetizable substrate 8 according to FIG. 1 in a sectional view.

According to this sectional view, it can be seen in addition to the arrangement in FIG. 1 that the magnetic holding unit 4 has a magnet 22 which is completely encapsulated within the holding unit 4. This magnet 22 can in particular be in the form of a permanent magnet and be encapsulated within the holding unit 4.

FIG. 3 shows a schematic representation of a part of a holding device 2 according to the invention for holding a magnetizable substrate 8 in a spatial view.

FIG. 3 shows the receiving unit 6 according to the invention with the symmetrically arranged recesses 14 formed in the form of longitudinal cutouts, which are clearly visible in this illustration, and the holding unit 4 arranged below the receiving unit 6.

FIG. 4 shows a schematic representation of the part of the holding device 2 according to the invention for holding a magnetizable substrate 8 according to FIG. 3 in a sectional view.

In this sectional view, in addition to the longitudinal recesses 14 of the holding unit 6 according to FIG. 4, the permanent magnet 22 arranged inside the holding unit 4 can be seen in particular.

FIG. 5 shows a schematic representation of a further part of the holding device 2 according to the invention for holding a magnetizable substrate 8 in a spatial view.

This further part of the holding device 2 according to the invention here concerns the adapter unit 10 according to the invention, which is shown here separately from the receiving unit 6 according to the invention. According to FIG. 5, the structure of an adapter unit 10 according to the invention is shown here as an example, comprising a first and a further guide element 16, 16', which are arranged above and below the spacing element 18, respectively.

In this case, the spacing element 18 likewise has symmetrically arranged recesses 14 arranged longitudinally, which in particular ensure direct contacting of a substrate 8 arranged within the adapter unit 10 in the course of processing, for example by means of cleaning liquids, drying air, coating agents and the like. In addition, the recesses 12 arranged symmetrically within the guide element 16, 16' in the present case for the feedthrough of a substrate 8 to be held can be seen. The fixing element 20 arranged above the guide element 16 serves in particular to fix the adapter unit 10 within the receiving unit 6 and is formed in the present case in the form of a clamping ring which permits in particular a structurally simple fixing of the adapter unit 10 within the receiving unit 6.

Furthermore, it can be seen according to FIG. 5 that the spacing element 18 has connecting tabs 17 for force-fitting and/or form-fitting to the first and or the second of the further guide element 16, 16', which is intended in particular to ensure a particularly simple connection between one or more guide element 16, 16' with the present spacing element 18.

FIG. 6 shows a schematic representation of the further part of the holding device 2 according to the invention for holding a magnetizable substrate 8 according to FIG. 5 in a sectional view.

According to this sectional view, in addition to the improved visibility of the plurality of connecting tabs 17 arranged on the spacing element 18 for force-fitting and/or
form-fitting with the guide element 16, 16', the permanent
magnet 22 arranged inside the holding unit 4 can also be
seen.

FIG. 7 shows a schematic representation of a system 1
according to the invention for transporting and/or processing
a plurality of substrates 8 in a spatial representation.

The system 1 according to the invention comprises a
plurality of holding devices 2 described above for holding a
substrate 8 and a holding unit 30 for holding the holding
devices 2, the plurality of holding devices 2 being arranged
within the holding unit 30 in such a way that, when a
substrate 8 is held separately, joint transport and/or joint
processing of the plurality of held substrates 8 can be carried
out in each case within a holding device 2.

The receiving unit 30 is formed in the present case in the
form of a basket and has a plurality of receiving elements 32
for receiving the holding devices 2, by means of which the
holding devices 2 can preferably be fastened in a form-
fitting and/or force-fitting manner in the receiving elements
32. In addition, the receiving unit 30 is presently arranged in
a transport box 34 for receiving the receiving unit 30, the
receiving unit 30 being fixed in this case by means of
damping elements 36 within the transport box 34. The
damping elements 36 can preferably be formed in the form
of foam inserts or the like.

The holding devices 2 arranged within the receiving unit
30 are further protected via protective covers 24, which have
a first opening 26 via which the protective cover 24 can be
fastened on one side to a receiving unit 4 of a subject holding
device 2. Moreover, the protective covers 24 comprise a
second opening 26' for detecting an orientation of a substrate
8 arrangeable in the holding device 2.

FIG. 8 shows a schematic representation of the individual
steps of a method according to the invention for transporting
and/or processing a plurality of substrates 8.

In this case, the method comprises the steps/stages of
receiving 50 a plurality of substrates 8 in a respective
holding device 2, receiving 52 the plurality of holding
devices 2 equipped with a respective substrate 8 in a
receiving unit 30 for receiving the holding devices 2, and
carrying out 54 a common transport and/or a common
processing of the plurality of received substrates 8.

By means of the holding device 2 according to the
invention or the system 1 and method according to the
invention for transporting and/or processing a plurality of
substrates 8, it is possible in particular that the use of a
holding device 2 according to the invention completely
eliminates the handling of individual tools during transport
and processing operations and thus considerably reduces the
risk of damage to the substrates 8. In addition, the use of a
holding device 2 according to the present invention enables
a particularly precise arrangement of the substrates 8, which
allows a particularly precise processing of the substrates 8.
Furthermore, by using the present holding device 8, in
particular by means of the replaceable adapter unit 10
according to the invention, one and the same holding device
2 is suitable for the use of a plurality of different substrates
8 by merely modifying or replacing the adapter unit 10,
which enormously reduces the necessary diversity of vari-
ants of present holding devices 2.

LIST OF REFERENCE SIGNS

1 System for transporting and/or processing a plurality of
substrates
2 Holding device
4 Magnetic holding unit

10

6 Receiving unit
8 Substrate (not explicitly shown here)
10 Adapter unit
12 Recess for the feedthrough of a substrate
14 Recess
16 First guide means/element
16' Second/further guide means/element
17 Connection piece
18 Spacing means/element
20 Fixing means/element
22 Permanent magnet
24 Protective cover
26 Opening
26' Second opening
30 Receiving unit
32 Receiving element
34 Transport box
36 Damping element
50 Picking up a plurality of substrates in each holding
device
52 Receiving the plurality of holding devices, each
equipped with a substrate, into a receiving unit
54 Performing common transport and/or common pro-
cessing of the plurality of substrates received.

The invention claimed is:

1. A holding device for holding a magnetizable substrate
during machining of at least one substrate surface, compris-
ing:
a magnetic holding unit arranged at the end for fixing the
substrate at the end via the generation of a magnetic
field,
a receiving unit arranged on the magnetic holding unit for
receiving the substrate,
a replaceable adapter unit arranged within the receiving
unit for guiding and shielding the substrate,
wherein
the replaceable adapter unit has at least one recess for the
feedthrough of the substrate, wherein the substrate is
fixable within the holding device in a laterally sup-
ported manner by means of the recess, wherein the
replaceable adapter unit has at least one first guide
element for guiding the substrate, the recess for the
feed-through of the substrate arranged within the at
least one first guide element, wherein the receiving unit
has number of recesses for contacting the substrate
surface during the machining, wherein the recesses are
formed in the form of cutouts arranged on a longitu-
dinal side of the receiving unit.

2. The holding device according to claim 1,
wherein
the receiving unit is shaped like a hollow cylinder and is
arranged with respect to the replaceable adapter unit
and the magnetic holding unit in such a way that a
substrate can be arranged centrally within the receiving
unit.

3. The holding device according to claim 1,
wherein
the replaceable adapter unit has at least one second guide
element for guiding the substrate.

4. The holding device according to claim 1,
wherein
the replaceable adapter unit has a spacing element for
spacing the at least one first guide element.

5. The holding device according to claim 4, wherein the spacing element has a plurality of connecting pieces for at least force-fitting or form-fitting to the at least one first guide element or the at least one second guide element or the at least one further guide element.

6. The holding device according to claim 4, wherein the spacing element is shaped like a hollow cylinder and is symmetrically arranged within the receiving unit.

7. The holding device according to claim 1, wherein the replaceable adapter unit has a fixing element for fixing the replaceable adapter unit within the receiving unit.

8. The holding device according to claim 1, wherein the magnetic holding unit has a magnet which is completely enclosed within the magnetic holding unit.

9. The holding device according to claim 1, wherein the permanent magnet is arranged within the magnetic holding unit in such a way that a material thickness of at least 0.5 mm of the magnetic holding unit is arranged between the permanent magnet and the receiving unit arranged directly on the magnetic holding unit.

10. The holding device according to claim 1, wherein a protective cover is provided for protecting the substrate which can be arranged inside the holding device.

11. The holding device according to claim 1, wherein the protective cover comprises a second opening for detecting an orientation of a substrate arrangeable in the holding device.

12. A system for at least transporting or processing a plurality of substrates, comprising:

a plurality of holding devices for holding a substrate according to claim 1, a receiving unit for receiving the holding devices, wherein the plurality of holding devices are arranged within the receiving unit in such a way that, when a substrate is received separately, at least joint transport or joint processing of the plurality of substrates received can be carried out in each case within a holding device.

13. The system according to claim 12, wherein the receiving unit is formed in the form of a basket with a plurality of receiving elements for receiving the holding devices.

14. The system according to claim 12, wherein a transport box is provided for receiving the receiving unit, wherein the receiving unit can be fixed within the transport box by means of damping elements.

15. The system according to claim 12, wherein a rotatable translation unit is provided for translating the receiving unit for processing the substrates arranged within the holding devices of the receiving unit in an x, y and z direction.

* * * * *